(12) United States Patent
Zhang et al.

(10) Patent No.: US 9,256,492 B1
(45) Date of Patent: *Feb. 9, 2016

(54) ITERATIVE DECODING SYSTEMS USING NOISE-BIASING

(71) Applicant: MARVELL INTERNATIONAL LTD., Hamilton (BM)

(72) Inventors: Yifei Zhang, Milpitas, CA (US); Nedeljko Varnica, San Jose, CA (US); Gregory Burd, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/279,217

(22) Filed: May 15, 2014

Related U.S. Application Data

(63) Continuation of application No. 12/357,200, filed on Jan. 21, 2009, now Pat. No. 8,745,468.

(60) Provisional application No. 61/022,440, filed on Jan. 21, 2008.

(51) Int. Cl.
*H03M 13/03* (2006.01)
*G06F 11/10* (2006.01)
*H03M 13/29* (2006.01)

(52) U.S. Cl.
CPC ....... *G06F 11/1004* (2013.01); *H03M 13/2951* (2013.01)

(58) Field of Classification Search
CPC .............. H03M 13/2951; H03M 13/2975; H03M 13/3753
See application file for complete search history.

(56) References Cited

U.S. PATENT DOCUMENTS

| | | | |
|---|---|---|---|
| 6,438,180 B1 | 8/2002 | Kavcic et al. | |
| 6,518,892 B2 * | 2/2003 | Shen et al. | 341/50 |
| 7,739,558 B1 * | 6/2010 | Farjadrad et al. | 714/704 |
| 2003/0023919 A1 * | 1/2003 | Yuan et al. | 714/755 |
| 2005/0135498 A1 * | 6/2005 | Yee | 375/267 |
| 2008/0301517 A1 * | 12/2008 | Zhong | 714/752 |
| 2010/0146371 A1 * | 6/2010 | Efimov et al. | 714/780 |

* cited by examiner

*Primary Examiner* — M. Mujtaba K Chaudry

(57) ABSTRACT

Systems, methods, and apparatus are provided for improving the iterative decoding performance of a decoder, for example, as used in a wireless communications receiver or in a data retrieval unit. A decoding technique may receive and process a set of channel samples using an iterative decoder. If the iterative decoder output indicates a decoding failure, noise samples may foe combined with the received channel samples to create biased channel samples. Noise sample may be generated using a pseudo-random noise generator and/or by using signals already present in the communications receiver or data retrieval unit. The biased channel samples may be provided to the iterative decoder and the iterative decoder may re-run using the biased channel samples.

20 Claims, 13 Drawing Sheets

$$H = \begin{matrix} 1 & 0 & 0 & 1 & 0 & 0 \\ 0 & 1 & 0 & 0 & 1 & 0 \\ 0 & 0 & 1 & 0 & 0 & 1 \\ 1 & 0 & 0 & 0 & 1 & 0 \\ 0 & 1 & 0 & 0 & 0 & 1 \\ 0 & 0 & 1 & 1 & 0 & 0 \\ 1 & 0 & 0 & 0 & 0 & 1 \\ 0 & 1 & 0 & 1 & 0 & 0 \\ 0 & 0 & 1 & 0 & 1 & 0 \end{matrix}$$

ITERATIVE DECODING SYSTEMS USING NOISE-BIASING

CROSS-REFERENCE TO RELATED APPLICATIONS

This application is a continuation of U.S. patent application Ser. No. 12/357,200, filed Jan. 21, 2009 (currently allowed), which claims the benefit under 35 U.S.C. §119(e) of U.S. Provisional Application No. 61/022,440, filed Jan. 21, 2008 (now expired), each of which is hereby incorporated by reference herein in its entirety.

BACKGROUND OF THE DISCLOSURE

Error correcting codes may be employed by communication and/or data storage systems to detect and correct errors in received or recovered data. Error correcting codes may be implemented by using an encoding process at a transmitter, in which redundancy is added to data, and an iterative decoding process at a receiver, in which the added redundancy is exploited through a series of iterative decoding steps, to correct errors. The effectiveness of an error correcting code may be characterized fey the number of errors per encoded data block that the error correcting code is capable of correcting. For example, an error correcting code may be able to correct up to t symbol errors. Error correcting codes are often able to correct a large number of the errors that may be present in a received data, and this may improve end-to-end reliability.

Error correcting codes may be decoded using an iterative message passing process implemented by an iterative decoder. For example, a min-sum or sum-product decoding algorithm may decode received samples using a process in which each iteration includes two update steps. In the first update step, messages may be passed from check nodes to bit nodes, and message updates may be performed by the bit nodes. In the second update step, the updated messages may be passed from bit nodes back to the check nodes, and message updates may be performed by the check nodes.

The iterative message passing algorithm used by the iterative decoder may occasionally fail to converge or may converge to an incorrect state, leading to bit-errors or sector-errors that generally degrade application performance. Such errors may occur when the iterative message passing algorithm incorrectly converges to an errant vector (sometimes known as a near-codeword error) and/or when the algorithms fails to converge to any stable decoding state. Often, iterative decoding algorithms suffer from an error floor, i.e., a fundamental system limit on the error-rate that cannot be improved simply by increasing the operational signal-to-noise ratio.

SUMMARY OF THE DISCLOSURE

Iterative decoding systems, techniques, and processes are disclosed for lowering the error-floors in iteratively decoded communications systems and/or receivers. For example, systems, techniques, and processes are disclosed in which an iterative decoding algorithm is prevented from converging to a near-codeword and/or is driven to converge to a correct codeword (rather than oscillate through unstably decoding states). The lowered error-floor provided by such an iterative decoding architecture may lead to improved application performance, fewer interruptions in service, and/or larger data transmission rates.

One aspect of the invention relates to a method for decoding a codeword using an iterative decoder. In one embodiment, communications hardware receives channel samples, and processes the channel samples using an iterative decoder. The output of the iterative decoder may then be used to determine if a decoding failed has occurred. If it is determined that a decoding failure has occurred, channel samples may be combined with a set of noise samples to obtain biased noise samples. The iterative decoder may then be re-run using the biased channel samples. This iterative decoding proceed may continue until either the iterative decoder converges to a correct codeword or until the decoding process has run for a predetermined number of times.

Another aspect of the invention relates to generating a set of noise samples for biasing a set of received channel samples. In one embodiment, noise samples may be generated by configuring values of a noise scaling factor parameter and a noise offset parameter,, and these values may be configured based on the received channel samples. Modified noise samples may be generated by permuting the noise samples, and biased channel samples may be generated by combining the received channel samples with the modified noise samples. In one embodiment, the combining may be done by adding the modified noise samples to the received channel samples. The biased channel samples may then be provided to an iterative decoder for further processing.

Another aspect of the invention relates to a system for iteratively decoding a received codeword. In one embodiment, receiver circuitry may be used to receive channel samples corresponding to a codeword transmitted over a channel, and detection circuitry may be used to generate a set of messages corresponding to the channel samples. Decoding circuitry may then decode the set of messages using an iterative decoder. In one embodiment, if a decoding failure (or non-convergence of the iterative decoder) is detected, noise-biasing circuitry may generate noise samples that can be used for noise biasing. In one embodiment, noise-biasing circuitry may generate a scaling factor parameter and an offset parameter based on an output of the iterative decoder, and generate the set of noise samples based on the scaling factor parameter and the offset parameter. Noise-biasing circuitry may then combine the set of noise samples with the received channel samples to produce modified channel samples, and these modified channel samples may then be provided to the iterative decoder for further processing.

Further features of the invention, its nature and various advantages will be more apparent from the accompanying drawings and the following detailed description.

BRIEF DESCRIPTION OF THE FIGURES

The above and other advantages of the invention will be apparent upon consideration of the following detailed description, taken in conjunction with the accompanying drawings, in which like reference characters refer to like parts throughout.

FIGS. 4A and 4B show an illustrative parity check matrix of an LDPC code and a graphical representation of a decoding process that may be used by an iterative decoder to produce a message estimate, respectively.

DETAILED DESCRIPTION OF THE DISCLOSURE

Figure 1A:
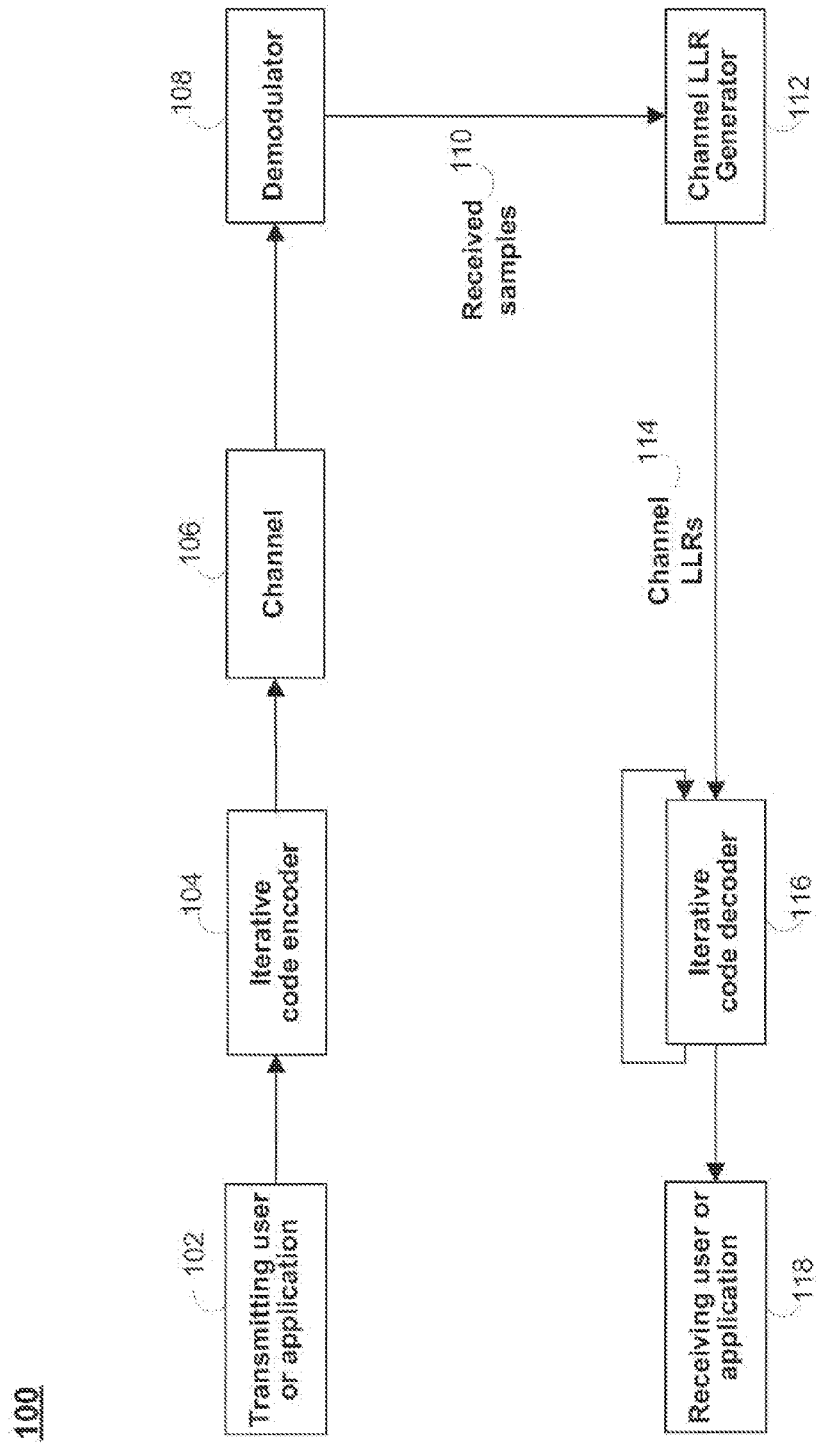
FIGS. 1A and 1B show illustrative communications systems employing iterative decoding.

FIG. 1A shows an illustrative communications system 100 employing iterative decoding in accordance with some embodiments. Communications system 100 may be particularly useful for decoding received information over memoryless channels, while communications system 150 (FIG. 1B) may be particularly useful for decoding received information over channels containing memory.

Communications system 100 may be used to transmit information from transmitting user or application 102 to receiving user or application 118. Transmitting user or application 102 may be any object or entity that produces information. For example, transmitting user or application 102 may correspond to a software program in a computer system or a to a component of a wireless communications transmitter in a radio system. Transmitting user or application 102 may produce information in the form of a data stream, and such a data stream may be represented by a sequence of symbol values that have been pre-processed by, for example, a source encoder (not shown in FIG. 1A). The information produced by transmitting user or application 102 may correspond to voice information, video information, financial information, or any other type of information that may be represented in digital or analog form, and the data stream produced by transmitting user or application 102 may be a digital data stream.

Transmitting user or application 102 may segment or otherwise divide the data stream into blocks of a certain fixed length, and each fixed block may be referred to as messages. The message may be of length k, meaning that the message includes k symbols, where each symbol may be binary data, ternary data, quaternary data, any other suitable type of data, or any suitable combination thereof. Iterative code encoder 104 may be used to encode the message to produce a codeword. Iterative code encoder 104 may be a LDPC encoder, a turbo encoder, or any other suitable encoder. The codeword may be of length n, where n≥k. Iterative code encoder 104 may use a generator matrix to produce the codeword. For example, iterative code encoder 104 may perform one or more operations, including one or more matrix operations, to convert the message into the codeword. The generator matrix may be referred to as G, and the codeword may be referred to as $\underline{c}$.

The codeword may be may be modulated or otherwise transformed into a waveform suitable for transmission and/or storage on channel 106. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

Channel 106 may refer to the physical medium through which the transmitted waveform passes or is stored on before being recovered at demodulator 108. For example, channel 106 may be a storage channel that represents a magnetic recording medium in a computer system environment or a communications channel that represents the wireless propagation environment in a wireless communications environment. Various characteristics of channel 106 may corrupt data that is communicated or stored thereon. For example, channel 106 may be a non-ideal memoryless channel or a channel with memory. The output of channel 106 may be demodulated and processed by demodulator 108 to produce received samples 110. For example, demodulator 108 may use frequency filters, multiplication and integration by periodic functions, and/or any other suitable demodulation technique to demodulate and/or process the output of channel 106. Received samples 110 may contain information related to the codeword, and/or received samples 110 may correspond to a corrupted or otherwise altered version of the codeword or the information originally output by iterative code encoder 104. For example, received samples 110 may contain a preliminary estimate or noisy version of the codeword produced by iterative code encoder 104, a probability distribution vector of possible values of the codeword produced by iterative code encoder 104, or to combinations of these as well other items.

Channel log-likelihood ration (LLR) generator 112 may be used to calculate channel LLRs 114 based on received samples 110. Channel LLRs 114 may correspond to initial LLR values determined based on received samples 110, a statistical description of channel 106, and/or the probability of the output of iterative code encoder 104. Channel LLRs 114 may be formed based on the received samples, and iterations may be performed within iterative code decoder 116. Iterative code decoder 116 may be used to iteratively correct and/or detect errors that may be present in received samples 110, for example, due to transmission through channel 106. To do so, iterative code decoder 116 may decode channel LLRs 114 using parity a check matrix to produce an estimate. The message estimate may be referred to as $\hat{m}$, and the parity check matrix may be referred to as H. Iterative code decoder 116 may use any of a number of possible decoding algorithms to produce the message estimate. For example, iterative code decoder 116 may use decoding algorithms known as belief propagation algorithms.

Figure 1B:
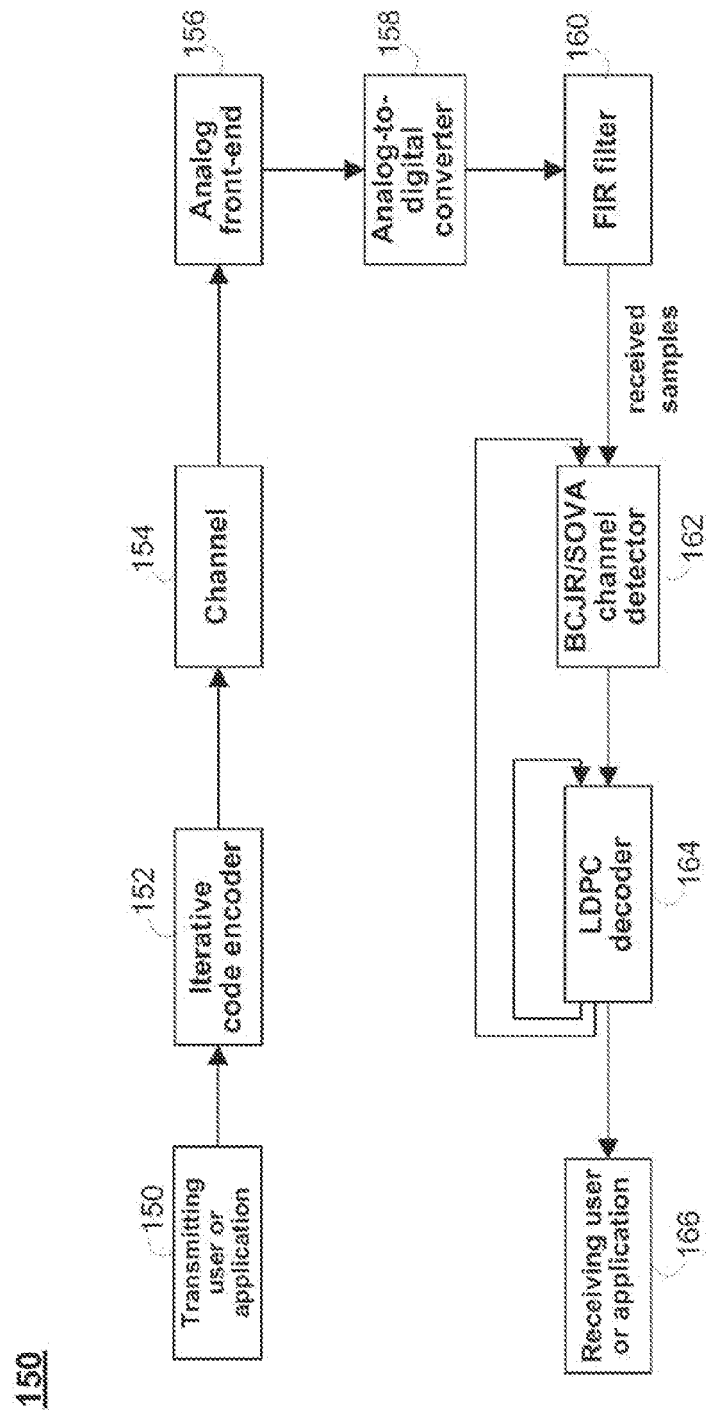

FIG. 1B shows another illustrative communications system employing iterative decoding in accordance with some embodiments. Communications system 150 may correspond to a more detailed embodiment of communications system 100 or communications system 150 may correspond to a different embodiment. Communications system 150 may be particularly useful for decoding codewords or received samples, such as received samples 110 (FIG. 1A), when the channel contains memory (e.g., when it is an inter-symbol interference (ISI) channel). Communications system 150 may correspond to a turbo equalization system, where decoding is done by iterating between a soft channel decoder (e.g, a SOVA or BCJR decoder) and soft code decoder (e.g., a LDPC or Turbo code decoder), as shown in FIG. 1B.

Transmitting user or application 150, iterative code encoder 152, and/or channel 154 may operate and include features similar or identical to those of transmitting user or application 102, iterative code encoder 104, and/or channel 106, of FIG. 1A, respectively. The output of channel 154 may be filtered by analog front-end 156, and then digitized by analog-to-digital converter 158. Samples from analog-to-digital converter 158 may be equalized by FIR filter 160 and passed to an iterative decoder, e.g., consisting of BCJR/SOVA channel detector 162 and LDPC decoder 164. BCJR/SOVA channel detector 162 may obtain channel LLRs based on received samples, and pass channel LLRs to LDPC decoder 164. LDPC decoder 164 may, in turn, update LLR estimates using code constraints signified by the parity check matrix, and provide new LLR values back to the BCJR/SOVA channel detector 162. This iterative process may continue until a certain stopping criterion has been met. Thus, communications system 150 may iteratively decode the output of FIR filter 160 using BCJR/SOVA channel detector 162 and LDPC decoder 164. The iterative decoder shown in FIG. 1B passes the messages between the channel detector and code decoder (known as a outer iteration). Code decoder can also pass the messages back to itself (known as an inner iteration). Thus, each outer (global) iteration includes one channel decoding and some number of inner iterations (e.g. five iterations) of the LDPC code decoder process.

Figure 5:
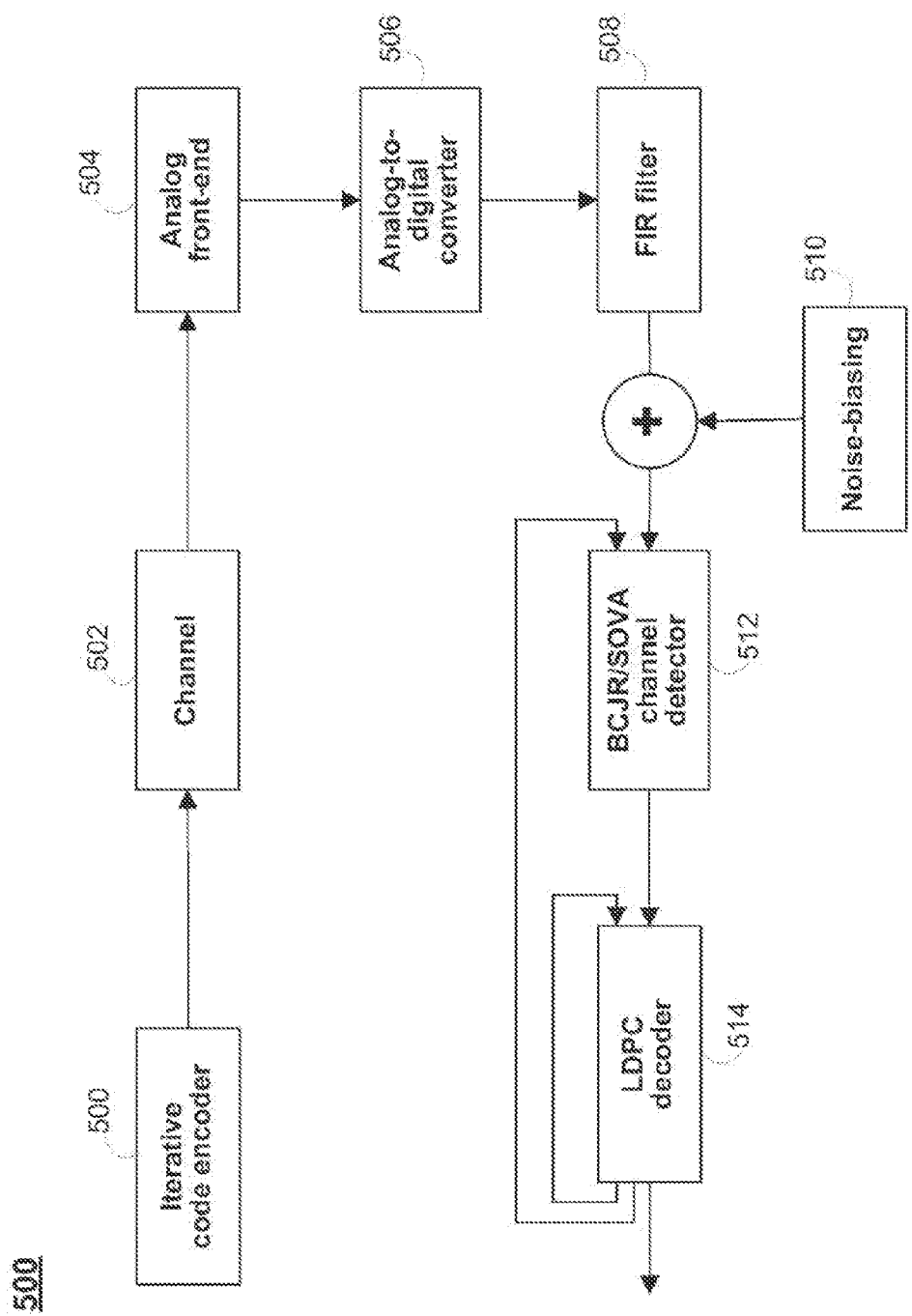
FIG. 5 shows structures and processes used by an iterative decoder in some embodiments to produce a message estimate from a received samples.
Figure 6:
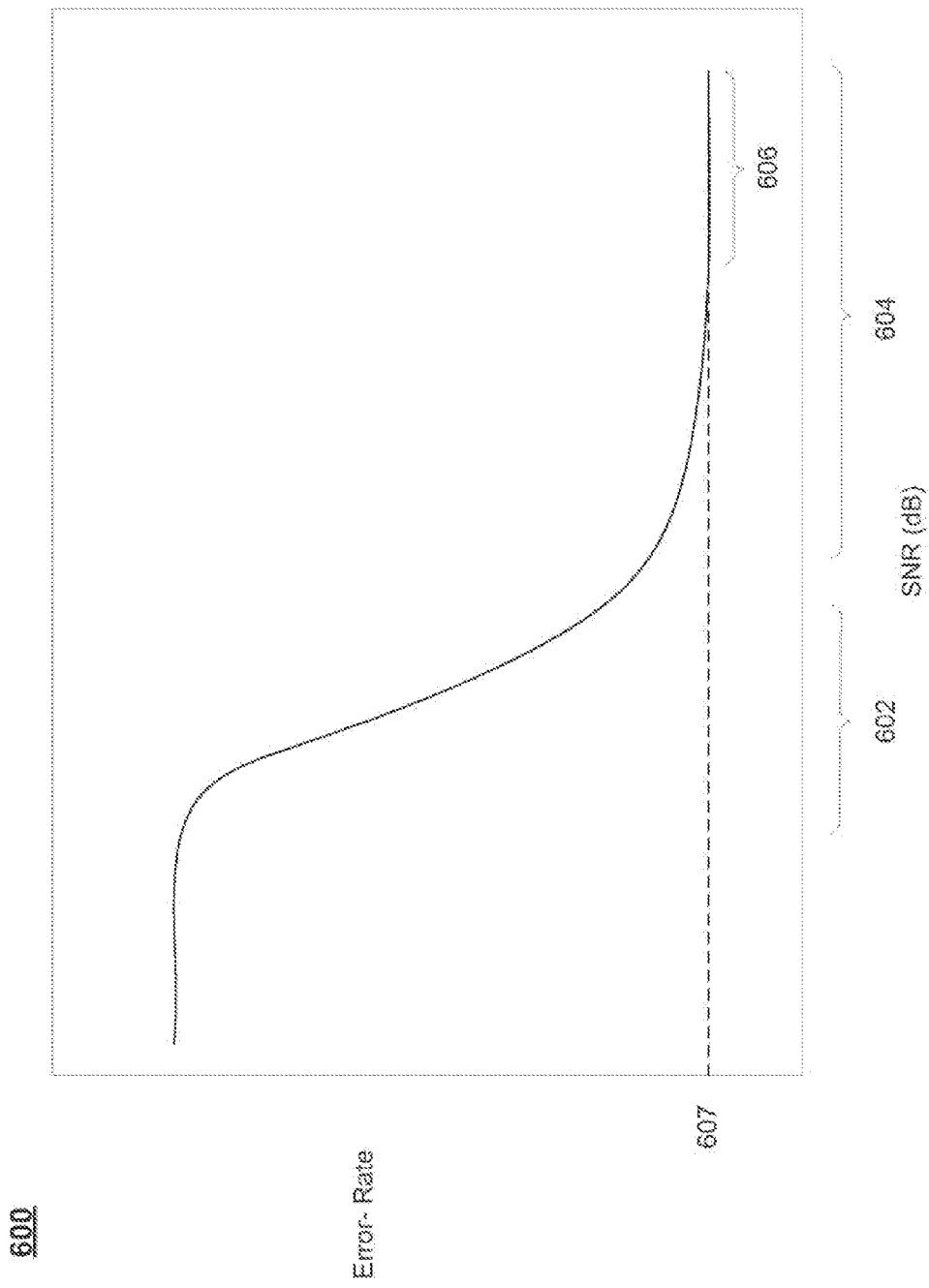
FIG. 6 depicts an illustrative error-rate curve for a code, such as an LDPC code, decoded using an iterative decoder.
Figure 7:
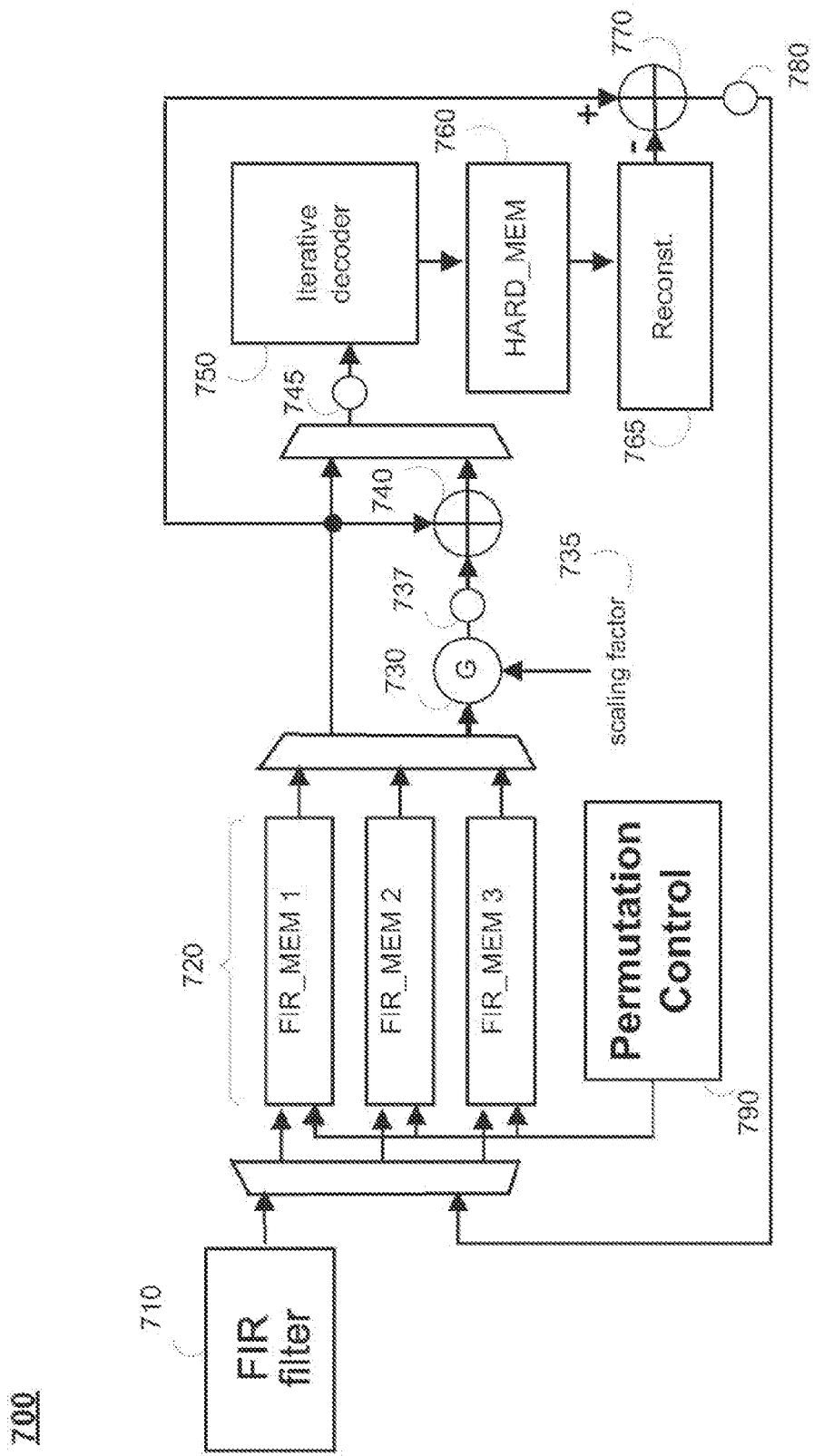
FIG. 7 illustrates noise-biasing in the systems and processes of an iterative decoder in accordance with some embodiments.

According to some embodiments, communications system 150 may include noise-biasing as shown in one embodiment in communications system 500 (FIG. 5). Communications system 500 (FIG. 5) may advantageously include noise-biasing 510 (FIG. 5) to decrease the decoding error-rate of communications system 150 (or similarly, of communications system 100). Noise-biasing 510 (FIG. 5) may be used in a communications systems such as communications system 100 or communications system 150 whether or not the channel (e.g., channel 106 or 154) has memory. In either case, noise-biasing 510 (FIG. 5) may prevent the iterative decoding process shown in FIG. 1A, FIG. 1B, or FIG. 5 from incorrectly converging to near-codewords and/or may direct the convergence to a correct codeword in the error-floor region (as shown in FIG 6). A further embodiment of the iterative decoder shown in communications system 500 is shown in FIG. 7. Iterative decoder 700 (FIG. 7) may permute noise samples at regular event intervals using permutation control 790 (FIG. 7). Iterative decoder 700 (FIG. 7) may, for example, use one of the processes illustrated in FIG. 10 or FIG. 11 to generate values for the noise samples, and may use an interleaving scheme identical or similar to the one illustrated in FIG. 8 to control permutation control 790 (FIG. 7).

Noise-biasing may be performed by adding random noise to the set of received channel samples, for example, using a random noise source. Alternatively or in addition, channel noise may be used. For example, iterative detector output (which may be almost free of error) may be taken, the ideal channel output corresponding to this sequence calculated, and then the resultant values may be subtracted from the received channel samples to create a noise-like sequence. This noise-like sequence may then interleaved and scaled to create suitable samples for noise-biasing. Iterative decoding may then repeated using these noise-biased channel samples.

The final decisions may be delivered to receiving user or application 166 (or 118 of FIG. 1A) after being processed by the iterative decoding process, e.g., the iterative decoding process shown in FIG. 1A, FIG. 1B, FIG. 5, and/or FIG. 7. Receiving user or application 166 (or 118 of FIG. 1A) may correspond to the same device or entity as transmitting user or application 150 (or 102 of FIG. 1A), or it may correspond to a different device or entity. Further, receiving user or application 166 (or 118 of FIG. 1A) may be either co-located or physically separated from transmitting user or application 150 (of 102 of FIG. 1A). If the iterative process corrects all errors that may be present, e.g., at the output of FIR filter 160, then the message estimate delivered to receiving user or application 166 (or 118) may be a logical replica of the message output by transmitting user or application 150 (or 102). Otherwise, the iterative decoder may declare error and the communication system will go into retry mode to try to recover the data, or send the erroneous data to the HOST if iterative decoder can not detect the error (this happens if the iterative decoder converged to a valid codeword, but not the one that was transmitted). In the latter case, the message estimate may differ from the message.

Figure 2:
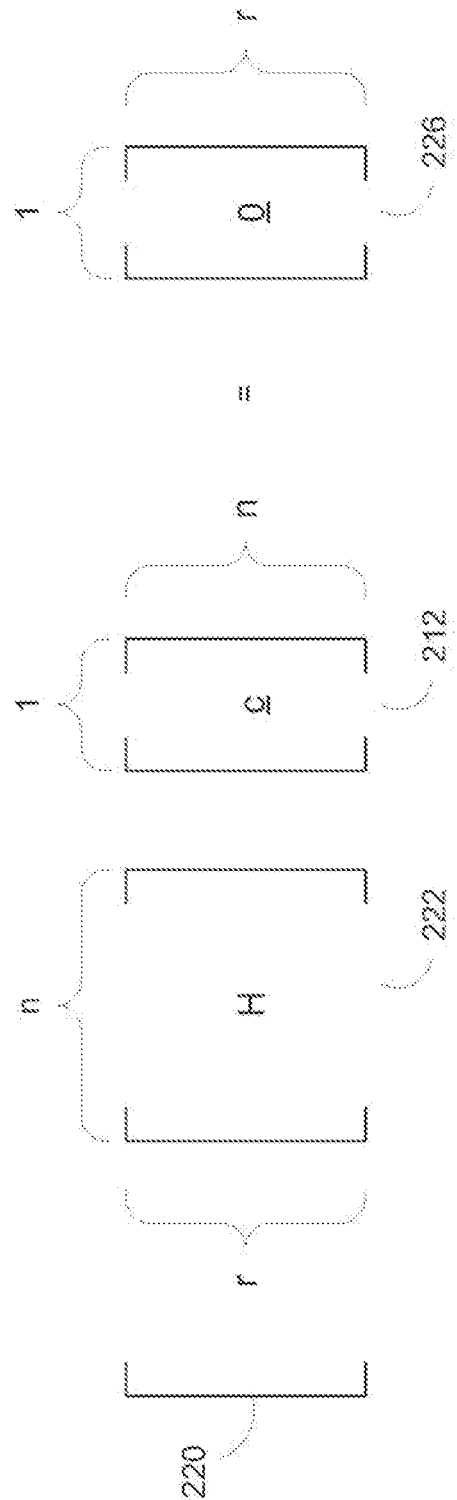
FIG. 2 shows an illustrative example of the properties of a parity check matrix in accordance with some embodiments.

FIG. 2 shows an illustrative example of the properties of a parity check matrix in accordance with some embodiments. Parity check matrix 222 of equation 220 is a matrix of size [r×n], where r satisfies the inequality r≥n−k. When parity check matrix 222 is multiplied by codeword 212, the result is zero-vector 226, which is a vector of size [r×1] where all elements equal zero. Parity check matrix 222 is any matrix that produces a null matrix, or a matrix of all zeros, of size [r×k] when multiplied by generator matrix 214. Thus, parity check matrix 222 is not unique, and may be chose, for example, to minimize resources such as storage and/or processing time.

Figure 3:
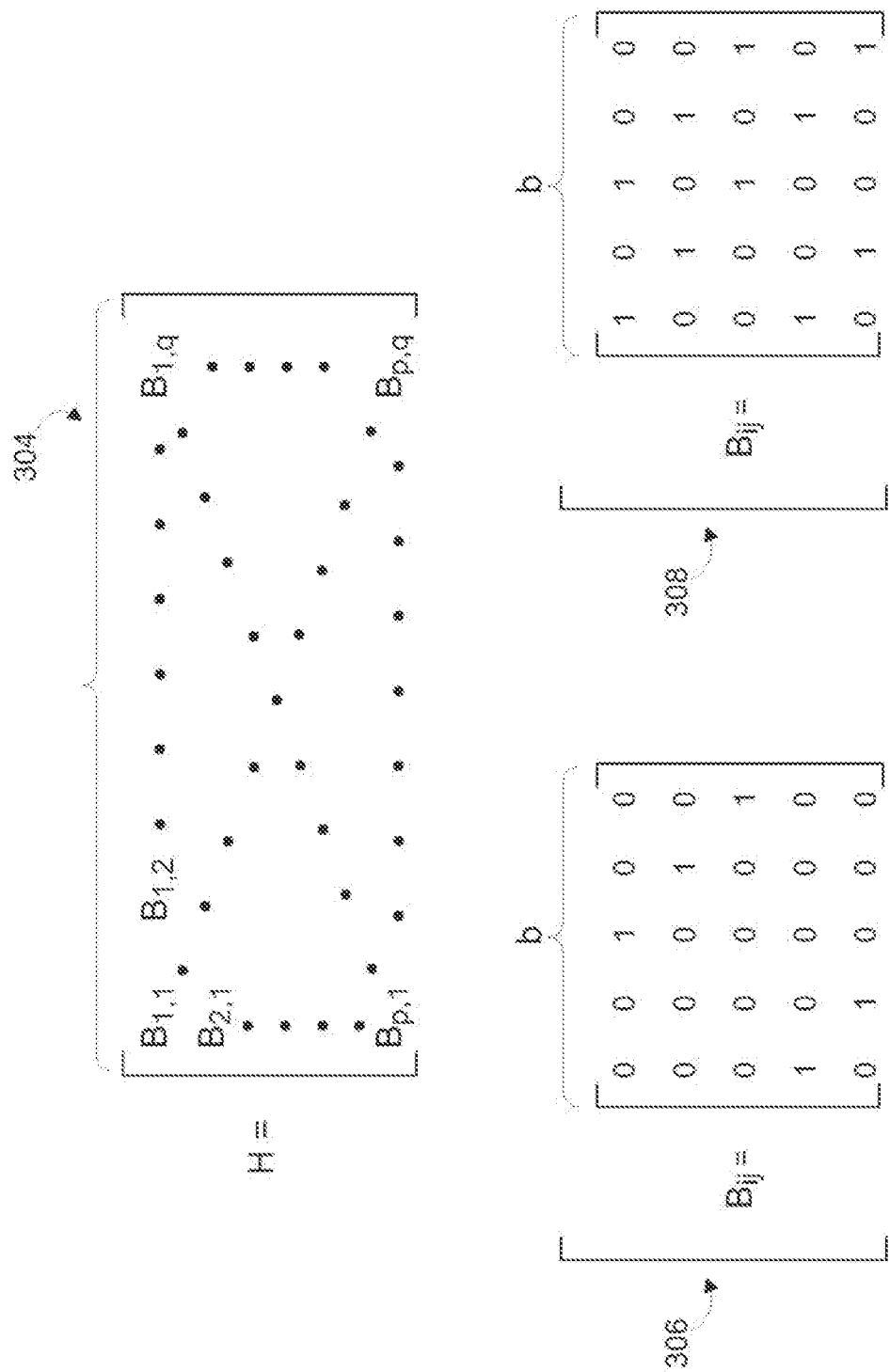
FIG. 3 shows an illustrative example of a parity check matrix in accordance with some embodiments.

FIG. 3 shows an illustrative example of parity check matrix 304 in accordance with some embodiments. Parity check matrix 304 may be used in the decoding process, for example, of communications system 100 (FIG. 1A) or 150 (FIG. 1B). Parity check matrix 304 includes [p×q] submatrices labeled, $B_{1,1}$, $B_{1,2}$, etc., as shown in FIG. 3. Each labeled submatrix is a [b×b] cyclic matrix (that is, each submatrix has b rows and b columns), and for a given submatrix, each row is a shifted version of the first row. For example, submatrix 306 is an illustrative submatrix (representing the submatrix having row index i and column index j, without loss of generality). The first row of submatrix 306 is [0 0 1 0 0], and each subsequent row is a cyclically shifted version of the first row. For example, the second row of submatrix 306 is equal to the first row but with every element (cyclically) shifted one position to the right, the third row of submatrix 306 is equal to the first row but with every element (cyclically) shifted two positions to the right, and so on. Submatrix 308 is another illustrative example of a suitable submatrix for parity check matrix 304. The first row of submatrix 308 is [1 0 1 0 0], and each subsequent row is a cyclically shifted version of the first row, as described above. Certain submatrices in parity check matrix 304 may be all zero matrices, where a zero-matrix is a matrix for which each element is equal to zero (a matrix with at least one non-zero element will be referred to as a non-zero matrix). Parity check matrix 304 is known as a quasi-cyclic matrix since it may be represented by a number of square and non-overlapping submatrices, each of which is a cyclic matrix.

Figure 4B:
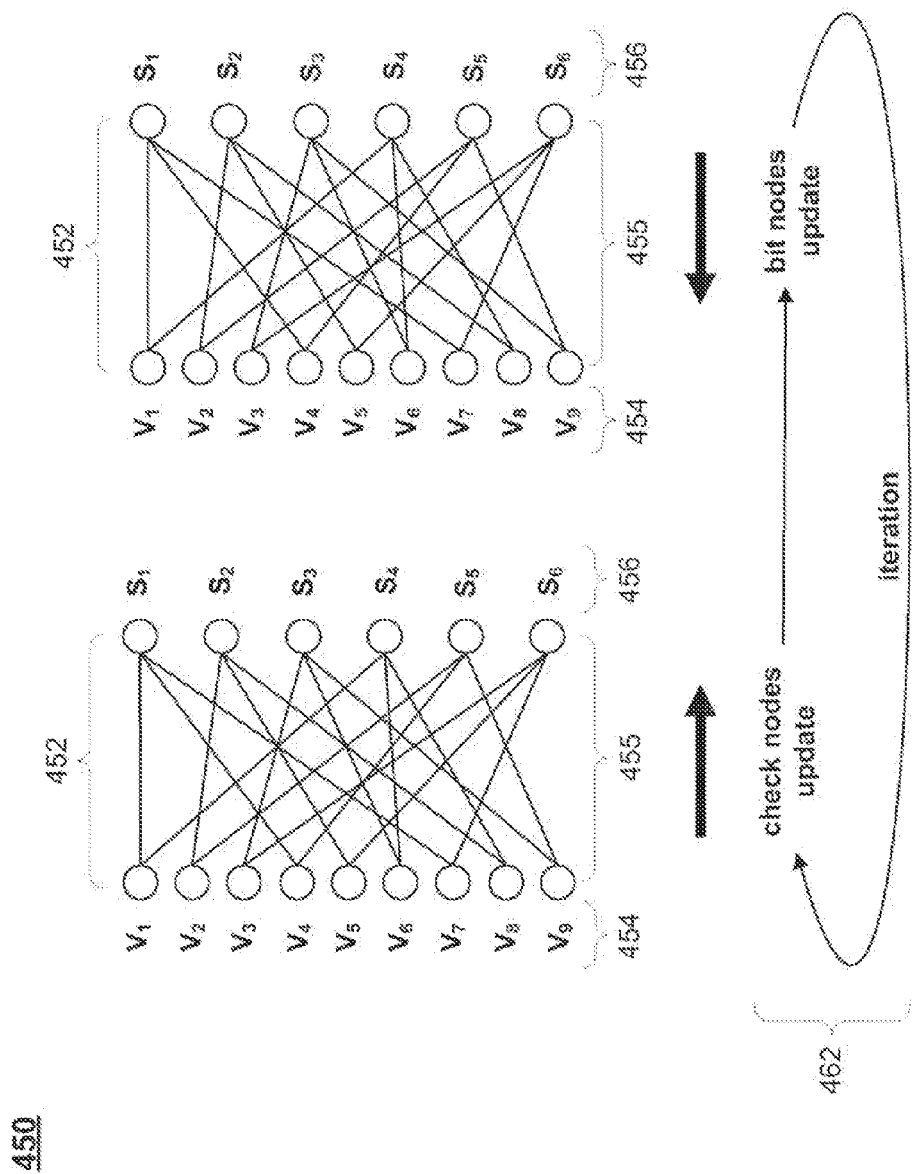

FIG. 4A shows an illustrative parity check matrix 402 for an LDPC code. Parity check matrix 402 has r=6 rows and n=9 columns. Thus, a codeword generated using parity check matrix 402 has a length of n=9 bit-nodes (i.e., symbols). Bit nodes 406 are labeled $v_1, v_2, \ldots v_9$ in FIG. 4A, and each bit node corresponds to a single column of parity check matrix 402. For example, the first bit node, $v_1$, corresponds to the first column in parity check matrix 402, the second bit node, $v_2$, corresponds to the second column in parity check matrix 402, and so on (the meaning of this correspondence will be further described in FIG. 4B).

The value of r denotes the number of check nodes used in the iterative decoder. Thus, the iterative decoder corresponding to parity check matrix 402 uses r=6 check nodes. Check nodes 406 are labeled $s_1, s_2, \ldots s_9$, and each check node corresponds to a single row of parity check matrix 402. For example, the first check node, $s_1$, corresponds to the first row in parity check matrix 402, the second check node, $s_2$, corresponds to the second row in parity check matrix 402, and so on (the meaning of this correspondence will be further described in FIG. 4B).

FIG. 4B graphically illustrates sample decoding process 450, which may be used by an iterative decoder to decode received samples, for example, received samples 110 (FIG. 1), to produce a message estimate. For simplicity of presentation, it will be assumed that parity check matrix 402 (FIG. 4A) has been used to generate FIG. 4B, as described below.

A Tanner graph (which may also be referred to as a bipartite graph) may be used to graphically represent a LDPC code. For example, Tanner graph 452 is a graphical representation of the LDPC code defined by parity check matrix 402. Bit nodes 454 represent each column in parity check matrix 402, and thus, there are n=9 bit nodes. Bit nodes may also be referred to as symbol nodes or variable nodes. Check nodes 456 represent rows of parity check matrix 402, and thus, there are r=6 check nodes. To create Tanner graph 452 from parity check matrix 402, a line may be drawn connecting a given bit node to a given parity check node if and only if a "1" is present in the corresponding entry in parity check matrix 402. For example, since the entry in the second row and fifth column of parity check matrix 402 is a "1", a line is drawn connecting the second check node ($S_2$) to the fifth bit node ($V_5$). Thus, if there are $\lambda$ "1"'s in a given column of parity check matrix 402, then there are $\lambda$ edges originating from the bit node corresponding to that column in Tanner graph 452. Similarly, if there are $\rho$ "1"'s in a given row of parity check matrix 222, then there are $\rho$ edges originating from the parity check node corresponding to that row in Tanner graph 452.

An iterative decoder, for example, as shown in communications system 100 (FIG. 1A) or 150 (FIG. 1B) may use an iterative two-step decoding algorithm that includes a check nodes update step and a bit nodes update step, as depicted by process 462, to decode received samples, such as received samples 110 (FIG. 1). During the first step (check nodes update step) of each iteration of process 462, messages are sent from bit nodes 454 to check nodes 456 for every pair of connected nodes (this "flow" of information is denoted by the right-pointing arrow in FIG. 4B). Check nodes 454 then perform computations based on the messages that are received. During the second step (bit nodes update step) of each iteration of process 452, messages are sent from bit nodes 456 to check nodes 454 for every pair of connected nodes (this is denoted by the left-pointing arrow in FIG. 4B). Process 462 is repeated until either the codeword has been decoded or until a threshold number of rounds has been reached. Process 462 may then produce a message estimate. The content of messages sent during each step of each iteration of process 462 depends on the decoding algorithm used in the iterative decoder. The content may correspond to LLR values, probabilities, hard decisions, or any other suitable type of content that is compatible with the decoding algorithm.

FIG. 5 shows structures and processes that may be used by an iterative decoder, such as the iterative decoder of communications system 100 (FIG. 1A) or 150 (FIG. 1B), in some embodiments to produce a message estimate from received samples (such as received samples 110 of FIG. 1A). Iterative code encoder 500, channel 502, analog front-end 504, analog-to-digital converter 506, FIR filter 508, BCJR/SOVA channel detector 512, and LDPC decoder 514 may function similarly or identical to iterative code encoder 152, channel 154, analog front-end 156, analog-to-digital converter 158, FIR filter 160, BCJR/SOVA channel detector 162, and LDPC decoder 164, of FIG. 1B, respectively.

Communications system 500 may be advantageous in improving (i.e., lowering) the error-rate performance of a communications system, such as communications system 100 (FIG. 1A) or 150 (FIG. 1B). Communications system 500 may use a soft-output Viterbi algorithm (also known as SOVA algorithm) to decode the output of FIR filter 508. Alternatively, LDPC decoder 514 may use a maximum a posteriori algorithm, for example, the BCJR algorithm, decode the output of FIR filter 508. The output of BCJR/SOVA channel detector 512 may be in the form of LLRs. The output of BCJR/SOVA channel detector 512 may be input to LDPC decoder 514.

LDPC decoder 514 may produce a preliminary estimate of a message using processes similar or identical to the processes described in FIG. 4A and 4B. For example, LDPC decoder 514 may use an iterative decoding algorithm including the min-sum or sum-product algorithm, or any suitable approximation or variation thereof, to produce output.

Noise-biasing 510 may be added to the output of FIR filter 508 to produce input to BCJR/SOVA channel detector 512. Noise-biasing 510 may be useful at least to prevent incorrect convergence or non-convergence of the iterative decoder to incorrect values. Noise-biasing 510 may use noise samples that are produced in a pseudo-random manner. For example, samples for noise-biasing 510 may be generated using a random sample generator such as an additive white Gaussian noise (AWGN) sample generator (or approximations thereof), or by using noise-like features already present in a communications system, such as communications system 100 (FIG. 1A) or 150 (FIG. 1B). Estimation error or the effects of thermal noise may be processed or used directly as samples for noise-biasing 510. Note that noise biasing is only used in a retry mode. That is, first iterative decoding is performed without noise-biasing. Then, if decoding failure is detected, noise-biasing is applied to move the decoder from a suboptimal point.

The method of noise-biasing shown in FIG. 5 is illustrative and variants of noise-biasing 510 may be used. For example, samples for noise-biasing 510 may not be directly added to the output of FIR filter 508, but rather, may be multiplied, linearly weighted, combined, or otherwise transformed in a general manner before being combined with received channel samples. Further, noise-basing 510 may include generating any number of noise samples, including a number of noise samples that is equal to the number of received samples, for example, the number of samples in received samples 110. A further embodiment of noise-biasing 510 will be described in relation to FIG. 7.

Communications system 500 may continue iterative processing between BCJR/SOVA channel detector 512 and LDPC decoder 514 for a certain number of iterations before terminating the iterative process and outputting a message estimate. For example, communications system 500 may run for a fixed and predetermined number of iterations, until convergence of LLRs values and/or until a output having zero syndrome weight is determined. If the iterative decoder still fails, then generate another set of noise by permuting or changing noise scalar, and re-run the decoder.

FIG. 6 depicts an illustrative error-rate curve for a code, such as an LDPC code, decoded using an iterative decoder such the iterative decoder of communications system 500 (FIG. 5). FIG. 6 may be generated by measuring the performance of a communications system, for example, communications system 500 (FIG. 5). Plot 600 depicts the signal-to-noise ratio (SNR) measured in decibels, for example, measured at the output of a demodulator such as demodulator 108 (FIG. 1A), on the horizontal axis and the error-rate, for example measured by comparing a message estimate to an originally transmitted message on the vertical axis. The error-rate may be any suitable error-rate, including the bit-error-rate or the symbol error-rate. Plot 600 illustrates the general shape of the error-rate curve for a communications system. The exact shape of the error-rate curve may differ slightly from plot 600 as the shape is dependent on many factors, including the codebook used by an encoder such as iterative code encoder 106 (FIG. 1), the characteristics of the channel (e.g., channel 106 of FIG. 1A), and the algorithms used by a demodulator, e.g., demodulator 108 (FIG. 1A) to produce received samples (e.g., received samples 110 of FIG. 1A).

Plot 600 includes two non-overlapping error regions. Waterfall region 602 includes a range of (low) SNR values for which the error-rate decreases relatively rapidly in SNR, while error-floor region 604 depicts a range of (high) SNR values for which the error-rate decreases slowly in SNR. Additionally, the error-rate is approximately invariant to an increase in the SNR in the region 606, which is included within region 604.

In waterfall region 602, non-near codeword errors contribute largely to the shape of plot 600. Non-near codeword errors may be characterized as errors that result when the output of the iterative decoder produces an incorrect candidate codeword that differs in many positions from the true codeword. Non-near codeword errors may also be characterized by a relatively large number of symbol errors and a relatively large syndrome weight. For example, non-near codewords may produce a large number of ones when multiplied by a parity check matrix used, for example, by iterative code encoder 104 (FIG. 1A). A non-near codeword error may indicate that the iterative decoder (e.g., as shown in FIG. 5) is not converging to a single state, but rather, that it is transitioning between two or more different states. As shown in FIG. 6, error-rate performance in waterfall region 602 may be readily increased (i.e., the error-rate may be lowered) by increasing the SNR.

In error-floor region 604, near codeword errors contribute largely to the shape of plot 600. Near codeword errors may be characterized as errors that result when the output of the iterative decoder produces an incorrect candidate codeword that differs in a small number of positions from the true codeword. Near codeword errors may also characterized by a small syndrome weight, i.e., a near-codeword produces a relatively small number of non-zero values when multiplied by a parity check matrix. As seen in FIG. 6, error-rate performance cannot be significantly improved in error-floor region 604 by increasing the SNR. For example, error-rate performance in region 606 is nearly invariant to increases in the SNR. Therefore, the error-floor 607 may impose a limit on the error-rate performance of a communications system such as communications system 100 (FIG. 1A) or 150 (FIG. 1B), particularly in high-SNR applications such as magnetic storage and/or recording applications (error-floor 607 refers to the lowest error-rate than may be achieved by a communications system at some maximum SNR value). In high-SNR applications, error-floor 607 may not be sufficiently low to ensure desirable performance. For example, in a magnetic recording applications, an extremely low sector-error-rate may be required (e.g., an error-rate of $10^{-10}$ or $10^{-15}$ may be required).

Error-floor 607 may indicate that that a corresponding iterative decoder, such as the iterative decoder of FIG. 5, is "trapped" in an incorrect state. For example, the message values passed in the iterative decoder may have converged to incorrect values. In such a scenario, a iterative decoder may repeatedly output the same (incorrect) hard decisions during successive. iterations of the iterative decoder operation, resulting in poor error-rate performance.

Noise-biasing (e.g., noise-biasing 510 of FIG. 5) may prevent an iterative decoder (e.g., iterative decoder 500 of FIG. 5) from becoming trapped in an incorrect state by continually adding pseudo-random noise to create biased channel samples, thereby ensuring that inputs to the iterative decoder are different from the original set, and as such may help iterative detector to avoid getting absorbed in a sub-optimal point. For example, for near-codeword errors, noise biasing 510 (FIG. 5) may drive an iterative decoder (e.g., the iterative decoder 500 of FIG. 5) to a different state. If noise-biasing (e.g., noise-biasing 510 of FIG. 5) is properly designed, an iterative decoder (e.g., iterative decoder 500 of FIG. 5) may output a message estimate equal to an originally transmitted message, as desired. Similarly, for non-near codeword errors, noise-biasing (e.g., noise-biasing 510 of FIG. 5) may drive an iterative decoder (e.g., iterative decoder 500 of FIG. 5) to convergence to a stable state. If noise-biasing (e.g., noise-biasing 510 of FIG. 5) is properly designed, this stable state may result in an iterative decoder producing a message estimate equal to a message, as desired.

FIG. 7 illustrates the integration of noise-biasing in the system and processes of an iterative decoder. Iterative decoder 700 may be a more detailed embodiment of the iterative decoding process depicted in FIG. 5). Iterative decoder 700 may obtain received samples from the output of FIR filter 710 for a memory channel, described in FIG. 1B, or received samples may correspond to received channel samples as shown in FIG. 1A for the case of channel without memory. FIR filter 710 may provide filtered or non-filtered received samples obtained from a channel such as channel 106 of FIG. 1A or channel 154 of FIG. 1B (for example, FIR filter may provide received samples obtained by a hard drive read-head after amplification and analog-to-digital processing in a magnetic storage system). The output of FIR filter 710 may then be stored in FIR memory storage module 720. Samples for noise-biasing may also be stored in FIR memory storage module 720. Samples for noise-biasing (e.g., samples for noise-biasing 510 (FIG. 5)) may be obtained as described below, except possibly for the initial iteration of the iterative decoder.

Samples for noise-biasing may be scaled by a factor determined in scaling factor module 735 to obtain scaled samples for noise-biasing 737. For example, scaling factor module 735 may use a gain device 730 that suitably increases or decreases the energy values of the stored samples for noise-biasing according to any suitable method so that the scaled samples for noise-biasing 737 are of energy-levels that are at a desired relative value compared to the energy-levels of output of FIR filter 710. Storing samples for noise-biasing in FIR memory module 720 is advantageous at least to reduce the memory usage of an iterative decoder, such as iterative decoder 700, when used in a communications system such as communications system 100 (FIG. 1A) or communications system 150 (FIG. 1B).

Adder 740 may add scaled samples for noise-biasing 737 to the output of FIR filter 710 to produce biased samples 745. Biased samples 745 may then be input to iterative decoder 750. For example, iterative decoder 750 may be an LDPC decoder that may be operating according to communications system 100 (FIG. 1A) or 150 (FIG. 1B). The output of iterative decoder 750 may contain information, for example, LLR values corresponding to received samples such as received samples 110. This information may be converted to hard decision estimates of the codeword and stored in memory by hard decision memory storage 760. Next, reconstruction filter 765 may estimate the output of FIR filter 710 by applying a filter to the values stored in hard decision memory storage 760. Adder 770 may then determine the difference between the output of reconstruction filter 765 and the output of FIR filter 710 to obtain a pseudo-random noise sequence 780. Pseudo-random noise sequence 780 may then be stored in FIR memory storage module 720, possibly by overwriting or replacing the initial memory values stored in FIR memory storage module 720.

In a preferred embodiment of iterative decoder 700, noise-biasing is run in a retry mode, i.e., after regular iterative decoder fails. At this point, hard decision memory storage 760 contains estimates for transmitted bits. These estimates contain errors (as regular iterative decoding has failed). However, most of the bits may be correct and only a fraction of the bits may be in error. Thus, based on the estimates in hard decision memory storage 760, corresponding reconstructed filer output 765 may be obtained (these are ideal, noise free, FIR samples corresponding to the bits in hard decision memory storage 760 transmitted over the channel). These samples may then be written back to FIR memory storage module 720 for later use as samples for noise-biasing.

Once noise-biasing samples are obtained, the iterative decoder may be run again, this time generating channel samples by adding scaled noise-biased samples to the original channel samples. Therefore, the described process includes three main steps. First, the iterative decoder is run, then samples for noise-biasing are obtained, and third, the iterative decoder is rerun with samples that have been augmented by the samples for noise-biasing.

Iterative decoder 750 may continue to process the messages in the manner described. However, permutation control 790 may be used to permute pseudo-random noise sequence 780 and/or samples for noise-biasing (e.g., samples for noise-biasing 510 of FIG. 5) stored in FIR memory storage before starting each outer iteration of the iterative decoder. Permutation control 790 may generate different (effective) sets of samples for noise-biasing at each iteration. When the iterative decoding process fails, the iterative decoder, e.g., iterative decoder 750, enters a noise-biasing mode. In this mode, permutation control 790 may be used to change the samples for noise-biasing and the inner iterative decoding process may be rerun with the new samples for noise-biasing. When the iterative decoding process succeeds, the iterative decoder returns to the normal decoding mode. Permuting the stored samples for noise-biasing may be advantageous as it may reduce or eliminate the correlation in closely spaced samples. Further, a deterministic or random interleaver may be used by permutation control 790 to permute the stored samples for noise-biasing.

Figure 8:
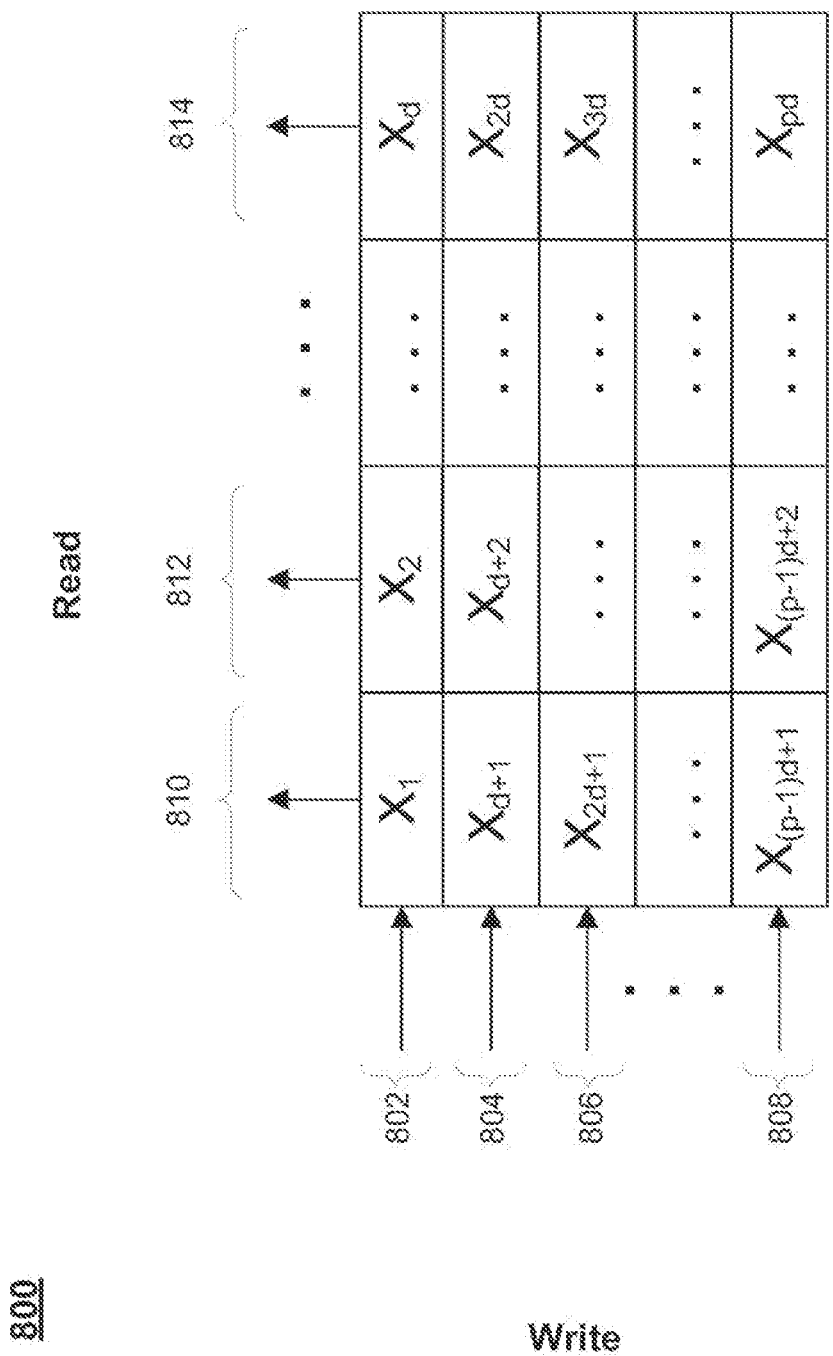
FIG. 8 illustrates interleaving systems and processes used to operate a permutation control according to some embodiments.

FIG. 8 illustrates an interleaving system and technique that may be used to operate a permutation control such as permutation control 790 (FIG. 7) according to some embodiments. Interleaver 800 may be used to permute a set of V samples for noise-biasing (e.g., samples for noise-biasing 510 of FIG. 5) that are stored, for example, in FIR memory storage module 720 of FIG. 7 (V may be any suitable positive integer) and used to remove or reduce the correlation among the closely spaced samples for noise-biasing. Suppose that V=p×d, where p and d are each positive integers. For example, if there are V=500 noise samples (corresponding to, for example, a hard drive sector that is 500 symbols in length), suitable choices for p and d may include (p=50, d=10), (p=10, d=50), and (p=25, d=20). Suppose that the V samples for noise-biasing are ordered and consecutively labeled $X_1, X_2, \ldots, X_{p \times d}$. Interleaver 800 may write the samples for noise-biasing into memory slots in row-order, as depicted in FIG. 8. For example, interleaver 800 may write samples $X_1, \ldots, X_d$ to first row 802, samples $X_{d+1}, \ldots, X_{2d}$ to second row 804, and so on. However, when reading samples for noise-biasing (for example, to apply to gain device 730 of FIG. 7), interleaver 800 may read samples for noise-biasing in column-order. For example, interleaver 800 may read samples $X_1, X_{d+1}, \ldots, X_{(p-1)d+1}$ from first column 810, samples $X_2, X_{d+2}, \ldots, X_{(p-1)d+2}$ from second column 812, and so on. Thus, the correlation between closely spaced samples for noising biasing may be reduced compared to an iterative decoder that does not include a permutation control such as permutation control 790 (FIG. 7).

Interleaver 800 may be particularly useful for removing correlation among samples for noise-biasing if the values of the noise samples (e.g., noise samples 123 of FIG. 1) are stored, for example, in FIR memory storage module 720 (FIG. 7) are never changed, or if they are changed only infrequently. The positions shown in FIG. 8 may correspond to a physical set of memory locations, for example, included or co-located with FIR memory storage module 720 (FIG. 7), or to a logical representation of the order in which samples for noise-biasing are written to and read from memory locations. In some cases, it may not be possible to choose integers p and d such that V=p×d. Interleaver 800 may readily be adapted to this scenario. For example, the number of samples for noise-biasing processed in one iteration may be increased or decreased so that a suitable values of p and d may be chosen to satisfy V=p×d. Alternatively, empty (or 'NULL') memory samples for noise-biasing may be created as placeholder values so that suitable values of p and d may be chosen. Interleaver 800 may also choose the values of p, d, and/or the sequence $X_1, X_2, \ldots, X_{pd}$ so that they are different at different instants of time. For example, if a decoding failure is repeatedly encountered, interleaver 800 may change one or more of these values upon each consecutive iteration until either a codeword is decoded correctly or until a specified number of decoding iterations have been executed.

Alternatively, interleaver 800 may use non-overlapping samples, for example, chosen from a common time-invariant set of samples, for noise-biasing during different outer iterations of the iterative decoder. Non-overlapping samples may be chosen according to an offset position P and/or a incremental step size, referred to as $P_{step}$. For example, in an initial outer iteration of an iterative decoder, such as iterative decoder 700, samples $X_1, X_2, \ldots, X_{pd}$ may be read sequentially input into interleaver 800. After a decoding failure, a shifted version of these samples may be used. For example, the samples may be used in the following order: $X_{12}, X_{13}, \ldots, X_{pd}, X_1, \ldots, X_{11}$. Thus, the offset position in this case is P=12. In this way, the ordering of the samples for noise-biasing may be changed or modified. Further, if several consecutive decoding errors occur, the value of P can be, for example, increased by an amount $P_{step}$ at the start of each new outer iteration of the iterative decoder.

Figure 9:
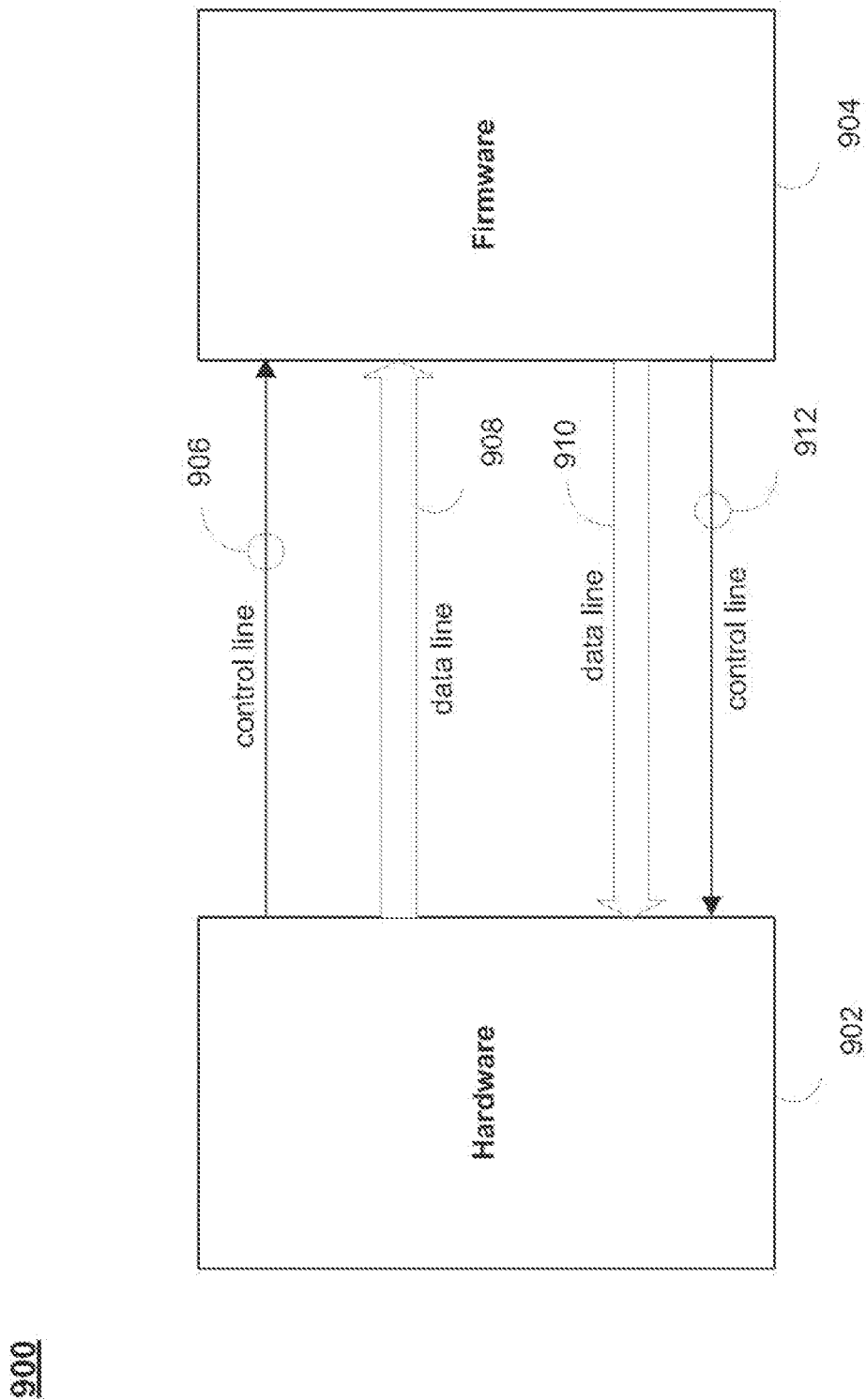
FIG. 9 illustrates a hardware and firmware interface that may be used by a scaling factor module to determine a scaling factor in accordance with some embodiments.

FIG. 9 illustrates a hardware and firmware interface that may be used by a scaling factor module such as scaling factor module 735 (FIG. 7) to determine a scaling factor in accordance with some embodiments. The scaling factor determined by interface 900 may be used, for example, with a gain device such as gain device 730 (FIG. 7), and may be included in an iterative decoder, such as iterative decoder 700 (FIG. 7). Interface 900 may calculate a scaling factor based on information provided by hardware 902 and/or computations performed by firmware 904. The desired value of the scaling factor may depend on many parameters including the target magnitude (or average energy-level) of the samples for noise-biasing (e.g., samples for noise-biasing 510 of FIG. 5) and/or the mean magnitude of the noise source (which may be a noise source such as pseudo-random noise 780). Firmware 904 may not have direct access to some or all of these quantities in which case firmware 904 may determine or estimate the unknown or partially known quantities.

To determine the target magnitude of the samples for noise-biasing, hardware 902 may report to firmware 904 decoding errors along with the syndrome error weights of errant codewords, for example, by using control line 906 and/or data line 908. If the syndrome error weight is small (i.e., contains a small number of non-zero values), then a near-codeword error is likely. Thus, firmware 904 may set the desired (or target) magnitude of the biasing noise to be a relatively large value so that the iterative decoder (for example, iterative decoder 700 of FIG. 7) is prevented from re-converging to a non-near codeword. However, if the syndrome error weight is large, then non-convergence among two or more non-near codewords is likely. In this case, firmware 904 may set the desired magnitude of the biasing noise to be a relatively small value so that the iterative decoder may converge to the correct codeword.

To determine the mean magnitude of the noise source, hardware 902 may report to firmware 904 the energy-levels of error samples, including, for example, the error samples produced by pseudo-random noise such as pseudo-random noise 780 of FIG. 7. Firmware 904 may then use any suitable averaging or weighting algorithm to determine the mean magnitude of the noise source. For example, firmware 904 may use an arithmetic average, a least-square average, or a general weighted average to determine the mean magnitude of the noise source. Alternatively, hardware 902 may directly provide firmware 904 with an estimate of the average magnitude of the error samples.

Interface 900 may include an error recovery mode during which hardware 902 sends information to firmware 904 and in which firmware 904 computes a scaling factor. For example, hardware 902 may send a control signal using control line 906 to firmware 904 indicating that decoding of a codeword has completed. Hardware 902 may also send information on the success or failure of the decoding through data line 908, including information on the type of failure, if a failure occurred. For example, hardware 902 may indicate that a near or non-near codeword error occurred and/or may send the syndrome weight of the decoded codeword using data line 908. Firmware 904 may then determine a scaling factor using, for example, any combination of the methods described above. Firmware 904 may then determine and send scaling factor information back to hardware using data line 910 and/or control line 912. Hardware 902 may use this scaling factor information to adjust the amplitudes (or energy-levels) of samples for noise-biasing (e.g., samples for noise-biasing 510 of FIG. 5). For example, hardware 902 may use the scaling factor with a gain device such as gain device 730 of FIG. 7 to adjust the amplitudes of the samples for noise-biasing.

Figure 10:
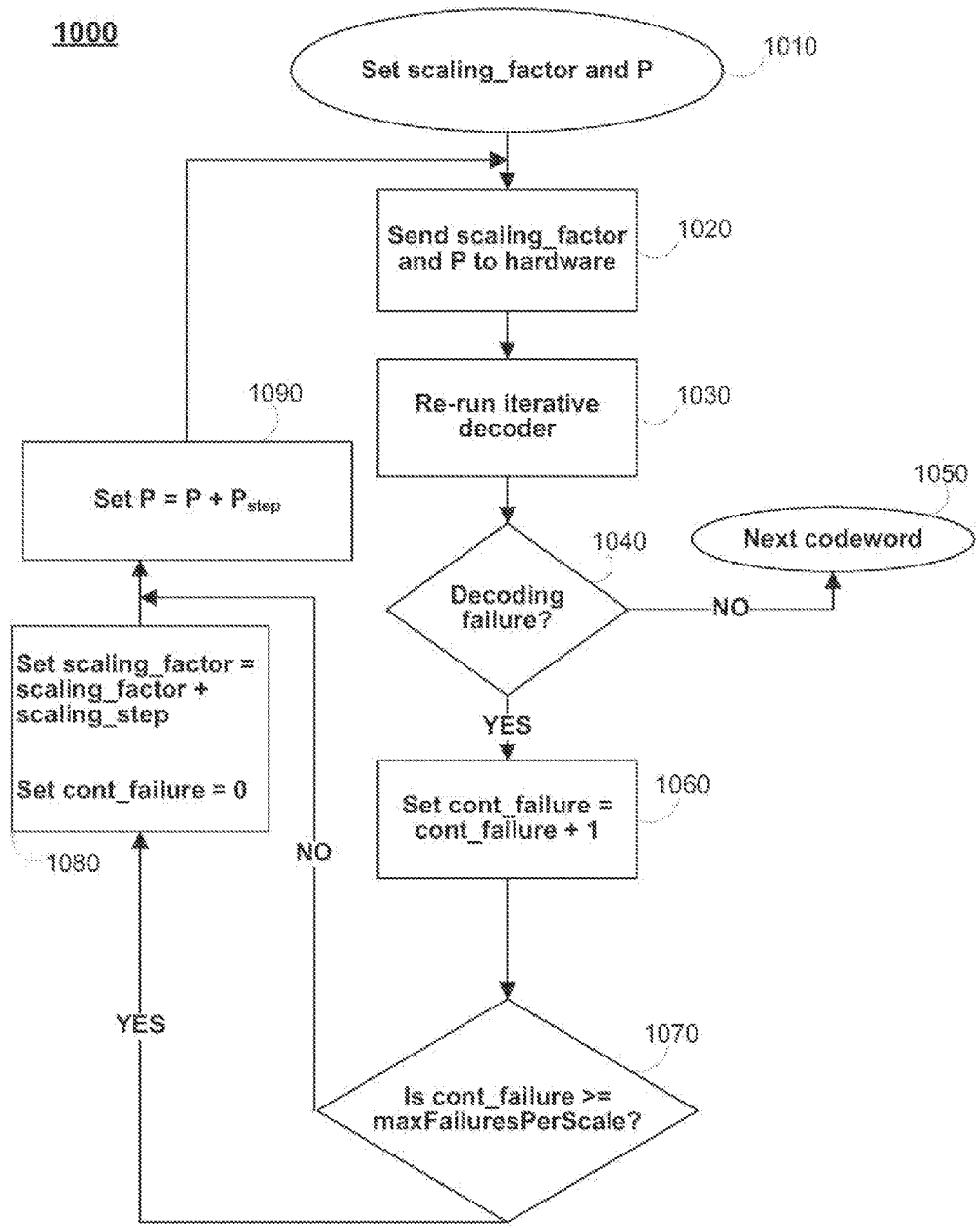
FIG. 10 shows an illustrative process that may be used to determine a scaling factor in an iterative decoder in accordance with some embodiments.

FIG. 10 shows an illustrative process that may be used to determine the scaling factor in an iterative decoder, such as iterative decoder 700 (FIG. 7). Process 1000 may be performed in firmware (FIG. 9) and/or may be included in scaling factor module 735 (FIG. 7). Process 1000 may begin at step 1010. At step 1010, initial values for the scaling factor, denoted by the parameter scaling_factor, and offset position P may be determined. The value P represents an offset used to select samples for noise-biasing from a possibly larger set of candidate noise samples. Initial values for scaling_factor and P may be set based on look-up tables, minimum or maximum possible values for these quantities, and/or based on any other suitable technique.

At step 1020 scaling_factor and/or P may be provided to hardware, for example, hardware 902 (FIG. 9). Values for scaling_factor and/or P may be delivered using data line 910 (FIG. 9) and/or control line 912 (FIG. 9). The hardware may use the value of P to selected samples for noise-biasing from, for example, FIR memory storage module 720 (FIG. 7). The hardware may use the value of scaling_factor to produce or otherwise obtain scaled samples for noise-biasing 737 (FIG. 7).

At step 1030, hardware 902 (FIG. 9) may rerun an iterative decoder with the scaled samples for noise-biasing 737 (FIG. 7), for example, hardware 902 (FIG. 9) may rerun iterative decoder 750 (FIG. 7). At step 1040, the presence of absence of a decoding failure may be determined baaed on the output of the iterative decoder used in step 1030. For example, communications system 100 (FIG. 1) may determine the syndrome weight of the candidate codeword produced in step 1030 using a parity check matrix. If it is determined at step 1040 that a decoding failure did not occur, then the communications system may output the decoded codeword as a message estimate, where the message estimate may be a replica of the originally transmitted message. If it is determined at step 1040 that a decoding error did occur, then process 1000 continues at step 1060.

At step 1060, the value of a counter cont_failure is increased by one integer. The value of cont_failure indicates the number of consecutive iterations of process 1000 for which the scale factor has remained constant (i.e., the cont_failure denotes the number of consecutive iterations for which same target noise level has been used). At step 1070 it is determined if cont_failure is greater than or equal to a threshold value of maxFailuresPerScale. If cont_failure is less than this threshold, process 1000 may continue to step 1090. If cont_failure is greater than or equal to this threshold, then scale_factor may be increased by an amount scaling_step, the value of cont_failure may be reset to zero, and process 1000 may continue to step 1090.

At step 1090, the value of P is increased by an amount $P_{step}$. Thus, $P_{step}$ new noise samples may be selected to replace $P_{step}$ "old" samples (i.e., samples used in the previous iteration of process 1000). These $P_{step}$ new samples may be selected from, e.g., FIR memory storage module 720 (FIG. 7) or they may be generated using, e.g., a random noise generator and/or various noise-like characteristics present in the communications system (e.g., communications system 100 of FIG. 1A or communications system 150 of FIG. 1B). Next, process 1000 may return to step 1020 and continue a next iteration of process 1000 as described above.

Figure 11:
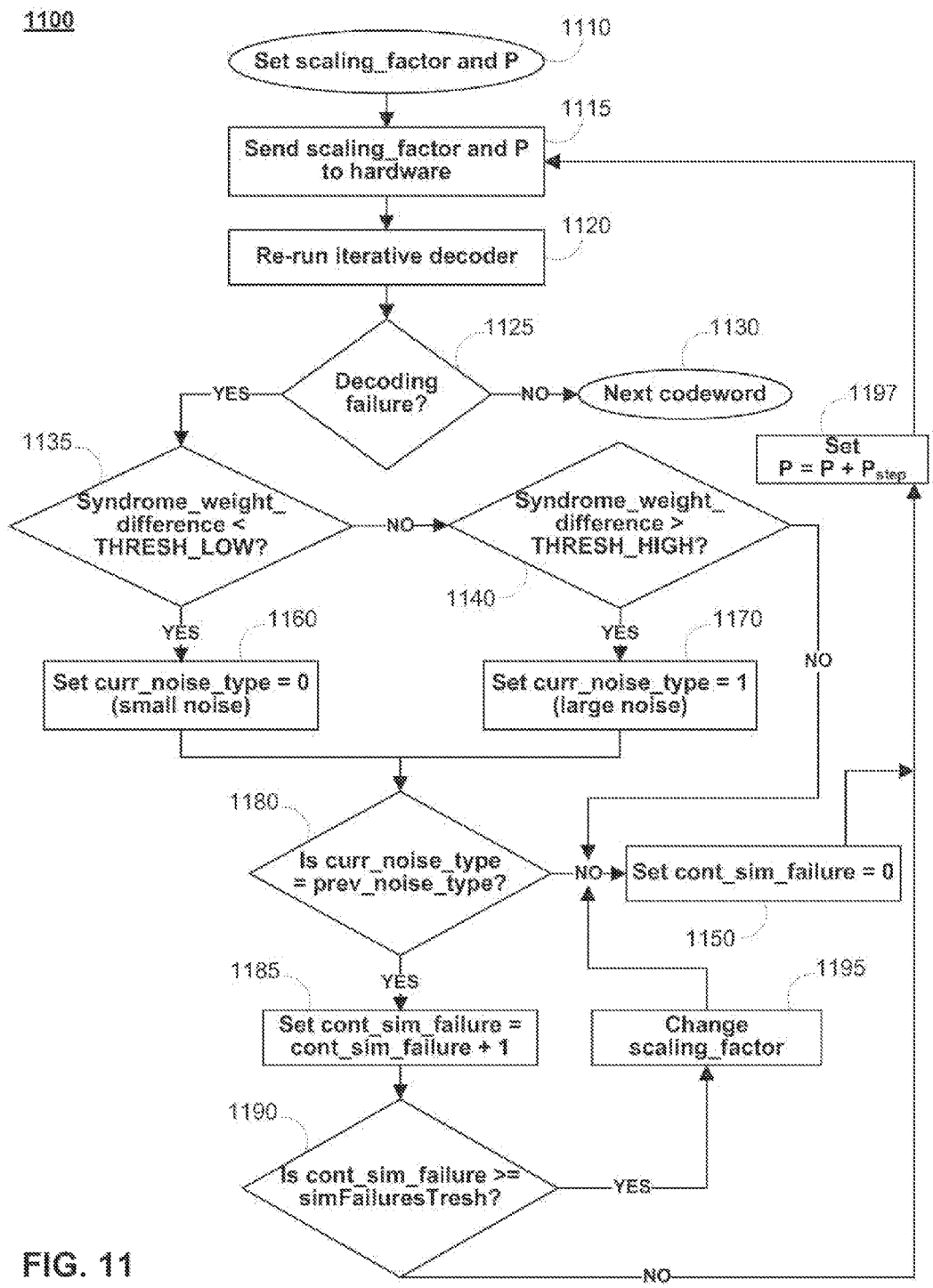
FIG. 11 shows another illustrative process that may be used to determine a scaling factor in an iterative decoder in accordance with some embodiments.

FIG. 11 shows another illustrative process that may be used to determine the scaling factor in an iterative decoder, such as iterative decoder 700 (FIG. 7). Process 1100 may be performed in firmware 904 (FIG. 9) and/or may be included in scaling factor module 735 (FIG. 7). Process 1100 may begin at step 1110, where initial values for scaling_factor and P may be determined. At step 1115, the values of scaling_factor and P may be sent to hardware such as hardware 902 (FIG. 9), and at step 1120, an iterative decoder may be rerun using these values of scaling_factor and P. At step 1125, process 1100 may determine whether a decoding failure occurred at step 1120. If a decoding failure is determined not to have occurred, process 1100 may continue to step 1130 and a next codeword may be decoded. If a decoding failure is determined to have occurred at step 1125, process 1100 may proceed to step 1135. Steps 1110, 1115, 1120, 1125, and 1130 may be executed similarly or identically to steps 1010, 1020, 1030, 1040, and 1050, respectively, of process 1000 (FIG. 10).

At steps 1135 and 1140, process 1100 may determine the syndrome weight of the current errant codeword and compare this syndrome weight to the syndrome weight of the previous errant codeword (i.e., in the previous iteration of process 1100). If the magnitude of the difference of these syndromes weights, denoted by syndrome_weight_difference, is greater than or equal to a lower threshold THRESH_LOW and less than or equal to an upper threshold THRESH_HIGH, then process 1100 may continue to step 1150. If, at steps 1135 and 1140, syndrome_weight_difference is determined to be less than is less than THRESH_LOW then process 1100 may continue to step 1160, where the value of curr_noise_type is set to zero (indicating that the magnitude of scaling factor may be too small to correctly decode the current codeword). Process 1100 may then continue to step 1180. If, at steps 1135 and 1140, syndrome_weight_difference is determined to be greater than THRESH_HIGH then process 1100 may continue to step 1170, where the value of curr_noise_type is set to one (indicating that the magnitude of scaling factor may be too large to correctly decode the current codeword). Process 1100 may then continue to step 1180.

At step 1180, process 1100 may compare the curr_noise_type determined in step 1160 or 1170 to the value of curr_noise_type determined in the last iteration of process 1100 (this value is denoted by prev_noise_type in FIG. 11). If curr_noise_type equals prev_noise_type, this may indicate that the scaling factor is not set appropriately (for example if curr_noise_type=prev_noise_type=0, this may indicate that scaling factor is too small to correctly decode the current codeword), and process 1100 may proceed to step 1185. If curr_noise_type does not equal prev_noise_type, this may indicate that the current scaling factor is set (approximately) correctly, and process 1100 may continue to step 1150.

At step 1185, the value of the parameter cont_sim_failure may be increased by one, e.g., to indicate that the scaling factor has not been correctly determined in the current iteration, and process 1100 may continue to step 1190. At step 1190, cont_sim_failure may be compared to a threshold value simFailuresThresh. If cont_sim_failure is greater than or equal to simFailuresThresh, then process 1100 may continue to step 1195, where the scaling factor is changed by changing the value of the parameter scaling_factor. For example, scaling_factor may be increased or decreased according to a fixed step size, or may be changed based on any of the parameters, counters, or variables present in process 1100. Process 1100 may then continue to step 1150. If cont_sim_failure is less than simFailuresThresh at step 1190, then the value of the scaling factor may be chosen properly for decoding the current codeword, and process 1100 may continue to step 1197.

At step 1150, the parameter cont_sim_failure may be used to track the number of consecutive decoding failures of the current codeword with the current value of the scaling factor and cont_sim_failure may be set to the value zero (e.g., signifying that the current value of the scaling factor may be appropriately set by process 1100). Process 1100 may then continue to step 1197. At step 1197, process 1100 may increase the value of P by an amount $P_{step}$. Thus, $P_{step}$ new noise samples may be selected to replace $P_{step}$ samples used in the previous iteration of process 1100. These $P_{step}$ new samples may be selected similarly or identically to the manner described in step 1090 of process 1000 (FIG. 10). Next, process 1100 may return to step 1115 and continue a next iteration of process 1100, as described above.

Step 1010 of process 1000 (FIG. 10) and step 1110 of process 1100 both include the step of initializing the sealing factor, denoted by parameter scaling_factor, by some technique. Any suitable method for may be used to initialize the scaling factor. For example, the scaling factor may be set based on the syndrome weight of the errantly decoded codeword. In this scheme, a relatively large value for the scaling factor may be chosen when the syndrome weight is small (as this may indicate a near-codeword type error), and a relatively small value for the scaling factor may be chosen when the syndrome weight is large (as this may indicate a non-near codeword type error). Alternatively, the scaling factor may be chosen to be a certain minimum (or with minor modifications to process 1000 of FIG. 10, maximum) permissible value upon initialization. As set of candidate scaling factors will then be chosen by process 1000 (FIG. 10), in monotonically-increasing order, until either a codeword is correctly decoded or until the iterative algorithm terminates. However, process 1000 (FIG. 10) may potentially skip over a desirable value of the scaling factor. In process 1100, candidates values of the scaling factor may be chosen in non-monotonic order, but may also enter a loop in which only a small set of scaling factor values are tested. Alternatively, the scaling factor may be chosen based on experience and/or pre-existing data.

At step 1080 of process 1000 (FIG. 10) and step 1195 of process 1100 the scaling factor, denoted by parameter scaling_factor, may be adjusted, for example, by an incremental value denoted by scaling_step. The value of scaling_step may be adjusted dynamically in either process 1000 (FIG. 10) or process 1100, and doing so may provide faster and/or more accurate decoding of a codeword. For example, scaling_step may be set based on the syndrome weight of the errantly decoded codeword. In this scheme, a relatively large value for scaling_step may be chosen when the syndrome weight is small (as this may indicate a near-codeword type error), and a relatively small value for scaling_step may be chosen when the syndrome weight is large (as this may indicate a non-near codeword type error). Decoding accuracy and speed when adapting the value of scaling_step may be dependent on the initial value chosen for scaling_step and either process 1000 (FIG. 10) or process 1100 could miss one or several desirable values of scaling_factor. In some embodiments, scaling_step may be chosen and/or designed so that all desired values of scaling_factor are chosen during successive iterations of process 1000 (FIG. 10) or process 1100.

What is claimed is:

1. A method comprising:
   combining channel samples with a set of noise samples to obtain a first set of biased channel samples;
   processing the first set of biased channel samples using an iterative decoder to obtain output samples of the iterative decoder;
   determining if iterative decoding failed based on the output samples; and
   in response to a determination that the iterative decoding failed:
   modifying the set of noise samples and combining the channel samples with the modified set of noise samples to obtain a second set of biased channel samples; and
   re-running the iterative decoder using the second set of biased channel samples.

2. The method of claim 1, wherein the set of noise samples is generated using a pseudo-random noise generator.

3. The method of claim 1, wherein the set of noise samples is generated using a deterministic process.

4. The method of claim 1, wherein the set of noise samples is generated using a signal that pre-exists in a communications receiver.

5. The method of claim 1, wherein a set of the channel samples is selected and used during one or more instances in which the iterative decoder is re-run.

6. The method of claim 1, wherein modifying the set of noise samples comprises:
   selecting a first set of samples from the set of noise samples;
   selecting an interleaving row depth p;
   selecting an interleaving column depth d; and
   associating with each element in a grid representation having p x d elements, one or more of the samples in the first set of samples.

7. The method of claim 1, wherein the set of noise samples is combined with a set of messages produced by the iterative decoder during one or more iterations of the iterative decoder.

8. The method of claim 1, wherein the set of noise samples is added to a set of messages produced by the iterative decoder.

9. The method of claim 1, further comprising:
   determining values of a noise scaling factor parameter and a noise offset parameter based on the channel samples; and
   generating the set of noise samples based on the values of the noise scaling factor parameter and the noise offset parameter.

10. The method of claim 9, wherein the values of the noise scaling factor parameter and the noise offset parameter are further determined based on a convergence rate of the iterative decoder.

11. A system comprising iterative decoding circuitry configured to:
   combine channel samples with a set of noise samples to obtain a first set of biased channel samples;
   process the first set of biased channel samples by applying iterative decoding to the first set of biased channel samples to obtain output samples;
   determine if the iterative decoding failed based on the output samples; and
   in response to a determination that the iterative decoding failed:
      modify the set of noise samples and combine the channel samples with the modified set of noise samples to obtain a second set of biased channel samples; and
      re-run the iterative decoder using the second set of biased channel samples.

12. The system of claim 11, wherein the iterative decoding circuitry comprises a pseudo-random noise generator configured to generate the set of noise samples.

13. The system of claim 11, wherein the iterative decoding circuitry is further configured to generate the set of noise samples using a deterministic process.

14. The system of claim 11, wherein the iterative decoding circuitry is further configured to generate the set of noise samples using a signal that pre-exists in a communications receiver.

15. The system of claim 11, wherein the iterative decoding circuitry is further configured to select and use a set of the channel samples during one or more instances in which the iterative decoding is re-run.

16. The system of claim 11, wherein the iterative decoding circuitry is further configured to automatically modify the set of noise samples by:
   selecting a first set of samples from the set of noise samples;
   selecting an interleaving row depth p;
   selecting an interleaving column depth d; and
   associating with each element in a grid representation having p x d elements, one or more of the samples in the first set of samples.

17. The system of claim 11, wherein the iterative decoding circuitry is further configured to combine the set of noise samples with a set of messages produced by the iterative decoding circuitry during one or more iterations of the iterative decoding.

18. The system of claim 11, wherein the iterative decoding circuitry is further configured to add the set of noise samples to a set of messages produced by the iterative decoding circuitry.

19. The system of claim 11, wherein the iterative decoding circuitry is further configured to:
   determine values of a noise scaling factor parameter and a noise offset parameter based on the channel samples; and
   generate the set of noise samples based on the values of the noise scaling factor parameter and the noise offset parameter.

20. The system of claim 19, wherein the iterative decoding circuitry is further configured to determine the values of the noise scaling factor parameter and the noise offset parameter based on a convergence rate of the iterative decoder.

* * * * *